US007528675B2

(12) United States Patent
Bae

(10) Patent No.: US 7,528,675 B2
(45) Date of Patent: May 5, 2009

(54) MICROSTRIP-TYPE BALUN, BROADCAST RECEIVING APPARATUS USING THE SAME AND METHOD OF FORMING THEREOF

(75) Inventor: Bum-youl Bae, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 365 days.

(21) Appl. No.: 11/288,375

(22) Filed: Nov. 29, 2005

(65) Prior Publication Data

US 2006/0132259 A1 Jun. 22, 2006

(30) Foreign Application Priority Data

Dec. 17, 2004 (KR) ...................... 10-2004-0107636

(51) Int. Cl.
*H03H 5/00* (2006.01)
*H03H 7/38* (2006.01)
*H01P 3/08* (2006.01)

(52) U.S. Cl. ............................ 333/26; 333/25; 333/33; 333/128

(58) Field of Classification Search .................. 333/26, 333/33, 35, 128
See application file for complete search history.

(56) References Cited

U.S. PATENT DOCUMENTS

| | | | | |
|---|---|---|---|---|
| 5,455,545 | A * | 10/1995 | Garcia | 333/26 |
| 6,359,528 | B1 * | 3/2002 | Dao | 333/26 |
| 6,441,696 | B1 * | 8/2002 | Westberg | 333/26 |
| 6,529,099 | B1 * | 3/2003 | Takenaka | 333/156 |
| 7,081,800 | B2 * | 7/2006 | He et al. | 333/26 |
| 7,250,828 | B2 * | 7/2007 | Erb | 333/26 |
| 2004/0041650 | A1 | 3/2004 | Deflaviis | |
| 2004/0119555 | A1 | 6/2004 | Deflaviis | |

FOREIGN PATENT DOCUMENTS

| | | |
|---|---|---|
| JP | 10-145103 | 5/1998 |
| JP | 11-068420 | 3/1999 |
| JP | 11-136011 | 5/1999 |
| KR | 1020000047708 | 7/2000 |

* cited by examiner

*Primary Examiner*—Robert Pascal
*Assistant Examiner*—Gerald Stevens
(74) *Attorney, Agent, or Firm*—Roylance, Abrams, Berdo & Goodman, L.L.P.

(57) ABSTRACT

Disclosed are a microstrip-type BALUN (BALance to UNbalance transformer), broadcast receiving apparatus using the same, and a method for forming the same. The BALUN includes a board and a microstrip line formed on the board for transforming an input unbalanced signal into a balanced signal. Since the microstrip-type BALUN is realized by a microstrip line which is a distributed constant line, the microstrip-type BALUN has an excellent performance even for high-frequency signals. Similarly, a broadcast receiving apparatus to which a microstrip-type BALUN is applied also has an excellent performance for high-frequency broadcasting signals.

12 Claims, 3 Drawing Sheets

MICROSTRIP-TYPE BALUN, BROADCAST RECEIVING APPARATUS USING THE SAME AND METHOD OF FORMING THEREOF

CROSS-REFERENCE TO RELATED APPLICATIONS

This application claims benefit under 35 U.S.C. § 119 of a Korean Patent Application No. 2004-107636, filed on Dec. 17, 2004, the entire content of which is hereby incorporated by reference.

BACKGROUND OF THE INVENTION

1. Field of the Invention

The present invention relates to a BALUN (BALance to UNbalance transformer), a broadcast receiving apparatus using the same, and method of forming thereof. More particularly, the present invention relates to a microstrip-type BALUN, a broadcast receiving apparatus using the same, which have improved performance, including improved performance for high-frequency signals, and a method of forming a microstrip-type BALUN.

2. Description of the Related Art

A BALUN (BALance to Unbalance transformer) is an element for transforming unbalanced signals into balanced signals. In other words, the BALUN is interposed between an element outputting unbalanced signals and an element receiving balanced input signals, thereby facilitating smooth signal transmission between the two elements.

The BALUN may be used in a broadcast receiving apparatus such as a set top box to transform unbalanced broadcasting signals into balanced broadcasting signals. Conventionally, a ferrite-type BALUN 10 shown in FIG. 1 has been used most widely in the broadcast receiving apparatus. The ferrite-type BALUN 10 is implemented by winding a coil around a ferrite core.

Since such a ferrite-type BALUN 10 is a lumped constant element, there is a problem that performance thereof is degraded for high-frequency signals (frequency above 1800 MHz, particularly).

Accordingly, the broadcast receiving apparatus using the ferrite-type BALUN 10 has a weakness in receiving satellite broadcasting signals with high-frequency.

SUMMARY OF THE INVENTION

The present invention has been developed to address the above drawbacks and other problems associated with the conventional arrangement. An aspect of the present invention is to provide a microstrip-type BALUN using a microstrip line, which is a distributed constant line, and a broadcast receiving apparatus using the same to obtain improved performance, including improved performance for high-frequency signals.

The foregoing and other exemplary objects and advantages of the present invention are substantially realized by providing a BALUN, according to an aspect of the present invention, comprising a board and a microstrip line formed on the board for transforming an unbalanced input signal into a balanced signal.

According to an exemplary implementation of the present invention, a microstrip line comprises a first microstrip line formed on the board for guiding the unbalanced signal input through an input terminal to a first output terminal as a first output signal, and a second microstrip line formed on the board for guiding the unbalanced signal input through the input terminal to a second output terminal as a second output signal with a phase difference of approximately 180 degrees for the first output signal.

According to another exemplary implementation of the present invention, a second microstrip line is formed to be longer than the first microstrip line by approximately ½ of a wavelength of the unbalanced signal input through the input terminal, such that the phase difference between the first output signal and the second output signal becomes 180 degrees.

According to another exemplary implementation of the present invention, BALUN may further include a third microstrip line formed on the board for matching the impedance between the first output terminal and the second output terminal. One end of the third microstrip line may be connected to one point on the first microstrip line and the other end of the third microstrip line may be connected to one point on the second microstrip line.

According to another exemplary implementation of the present invention, the lengths of the first microstrip line, the second microstrip line and the third microstrip line are approximately ¼, ¾ and ½ of the input wavelength, respectively.

According to an exemplary implementation of the present invention, a broadcast receiving apparatus comprises a board, a first broadcasting signal processing element formed on the board for outputting an unbalanced broadcasting signal, a second broadcasting signal processing element formed on the board for receiving an balanced input broadcasting signal, and a BALUN having a microstrip line on the board for transforming the unbalanced broadcasting signal output from the first broadcasting signal processing element into the balanced broadcasting signal and outputting the balanced broadcasting signal to the second broadcasting signal processing element.

According to another exemplary implementation of the present invention, a microstrip line in the BALUN comprises a first microstrip line formed on the board for outputting the unbalanced broadcasting signal input through an input terminal to a first output terminal as a first output signal, and a second microstrip line formed on the board for outputting the unbalanced broadcasting signal to a second output terminal as a second output signal with the phase difference of approximately 180 degrees for the first output signal.

According to another exemplary implementation of the present invention, a second microstrip line is formed to be longer than the first microstrip line by approximately ½ of a wavelength of the unbalanced signal input through the input terminal, such that the phase difference between the first output signal and the second output signal becomes 180 degrees.

According to another exemplary implementation of the present invention, a microstrip line provided to the BALUN further may comprise a third microstrip line formed on the board for matching the impedance between the first output terminal and the second output terminal. One terminal of the third microstrip line may be connected to one point on the first microstrip line and the other terminal of the third microstrip line may be connected to one point on the second microstrip line.

According to another exemplary implementation of the present invention, the lengths of the first microstrip line, the second microstrip line and the third microstrip line are approximately ¼, ¾ and ½ of the input wavelength, respectively.

BRIEF DESCRIPTION OF THE DRAWINGS

The above aspects and features of the present invention will be more apparent by describing certain embodiments of the present invention with reference to the accompanying drawings, in which like reference numerals will be understood to refer to like parts, components and structures, where.

DETAILED DESCRIPTION OF EXEMPLARY EMBODIMENTS

Figure 1:
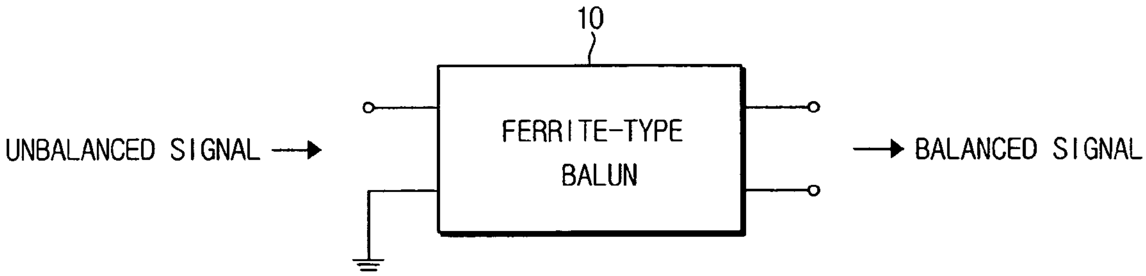
FIG. 1 (PRIOR ART)
FIG. 1 is a schematic view of a BALUN used in a broadcast receiving apparatuses in accordance with the related art.

Hereinafter, certain exemplary embodiments of the present invention will be described in greater detail with reference to the accompanying drawings.

In the following description, as noted above, same reference numerals are used for the same elements throughout the drawings. The matters defined in the description such as a detailed construction and elements are nothing but the ones provided to assist in a comprehensive understanding of the invention. Thus, one of ordinary skill in the relevant art will appreciate that various implementations of the present invention can be carried out in alternative manner without departing form the teachings of the present invention. Also, well-known functions or constructions are not described in detail for clarity and conciseness.

Figure 2:
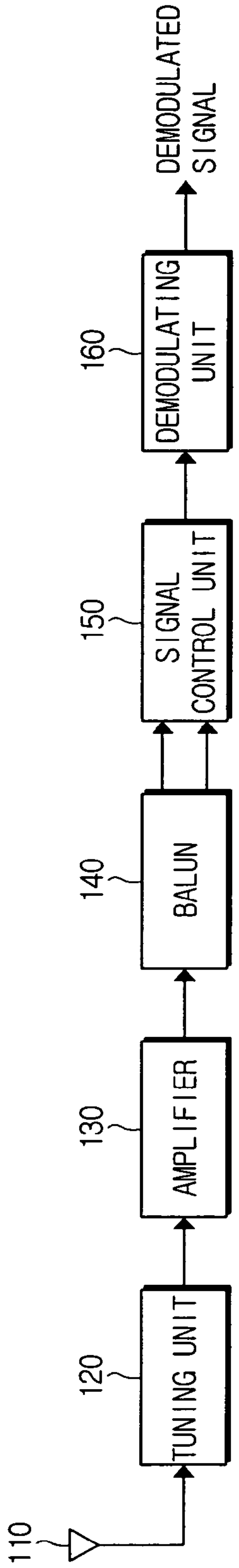
FIG. 2 is a block diagram of a broadcast receiving apparatus to which a microstrip-type BALUN is applied, according to an exemplary embodiment of the present invention.

FIG. 2 is a block diagram of a broadcast receiving apparatus with a microstrip-type BALUN according to an embodiment of the present invention. Referring to FIG. 2, the broadcast receiving apparatus has an antenna 110, a tuning unit 120, an amplifier 130, a BALUN 140, a signal control unit 150 and a demodulating unit 160.

The tuning unit 120 tunes in broadcasting signals of a predetermined frequency band among the broadcasting signals input through the antenna 110. The amplifier 130 amplifies the broadcasting signals tuned by the tuning unit 120 and then outputs the amplified signals. In this regard, the broadcasting signals output from the amplifier 130 are unbalanced signals.

The BALUN 140 transforms the unbalanced broadcasting signals of the amplifier 130 into balanced broadcasting signals and then outputs the balanced signals. The BALUN 140 is a microstrip-type BALUN realized by forming a microstrip line on a board. Description of the BALUN 140 will be provided in more detail below.

The signal control unit 150 adjusts the input signals to a predetermined intensity and then outputs the signals. In an exemplary implementation, the signal control unit 150 receives the balanced broadcasting signals from the BALUN 140 and outputs the broadcasting signals which are adjusted to a predetermined intensity. The demodulating unit 160 demodulates the broadcasting signals with the predetermined intensity which are received from the signal control unit 150. Finally, the broadcast receiving apparatus generates detection signals after detecting the demodulated signals and plays the corresponding broadcasting signals using the detection signals.

The above-mentioned BALUN 140 will be described in more detail herein below.

As described above, the BALUN 140 transforms unbalanced input broadcasting signals into balanced broadcasting signals and outputs the balanced broadcasting signals. In other words, the BALUN 140 is interposed between a broadcasting signal processing element outputting the unbalanced broadcasting signals and a broadcasting signal processing element receiving the balanced input broadcasting signals, thereby smoothly performing signal transmissions between both of the broadcasting signal processing elements. Referring to FIG. 2, the amplifier 130 corresponds to a broadcasting signal processing element outputting unbalanced broadcasting signals and the signal control unit 150 corresponds to a broadcasting signal processing element receiving balanced input broadcasting signals.

The BALUN 140 is realized by forming a microstip line on the board of the broadcast receiving apparatus, while the board has the components such as the amplifier 130 and the signal control unit 150 provided thereon. The microstrip line formed on the board is a strip line for transforming the input unbalanced signals into the balanced signals and then outputting the balanced signals.

Figure 3:
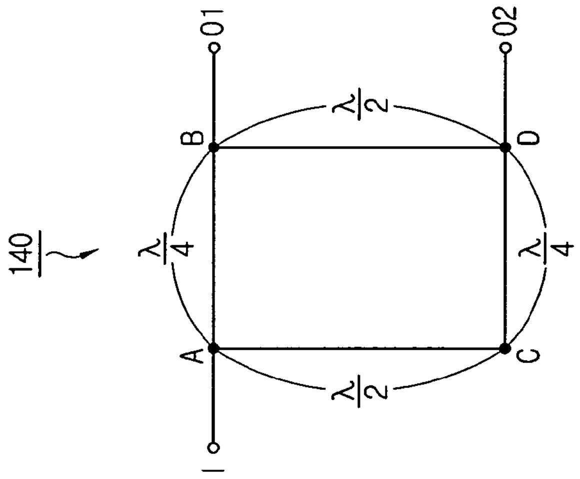
FIG. 3 is a conceptual view of the BALUN shown in FIG. 2.

FIG. 3 is a conceptual view of the BALUN 140 shown in FIG. 2. The unbalanced broadcasting signals are input to the BALUN 140. At this time, the unbalanced broadcasting signals are input to one input terminal, and the other input terminal should be grounded. Referring to FIG. 3, only one input terminal I for receiving the unbalanced broadcasting signals is depicted in the BALUN 140. The grounded input terminal is not shown for the convenience of description.

From the BALUN 140, balanced broadcasting signals are output. Referring to FIG. 3, the BALUN 140 has two output terminals O1 and O2 through which the balanced broadcasting signals are output.

The phase difference of the two broadcast signals output from the BALUN 140 should be 180 degrees. In other words, the phase difference between an output signal output through the first output terminal O1 (hereinafter, referred as "first output signal") and an output signal output through the second output terminal O2 (hereinafter, referred as "second output signal") should be 180 degrees.

Accordingly, the microstrip line should be disposed between the input terminal I and the first/second output terminals O1/O2 so that the phase difference between the first output signal and the second output signal is 180 degrees.

According to an exemplary implementation, the microstrip line formed between the input terminal I and the first/second output terminals O1/O2 can be realized with two microstrip lines. One is a first microstrip line AB, which is formed so that the unbalanced broadcasting signals input to the input terminal I is output through the first output terminal O1 as the first output signal. The other is a second microstrip line ACD (=AC+CD), which is formed so that the unbalanced broadcasting signals input to the input terminal I is output through the second output terminal O2 as the second output signal at a phase difference of 180 degrees with respect to the first output signal.

According to an exemplary implementation, in order to make the phase difference of 180 degrees between the first output signal O1 and the second output signal O2, the length of the second microstrip line ACD may be longer than that of the first microstrip line AB by $\lambda/2$, wherein $\lambda$ is an input wavelength which is the wavelength of the unbalanced broadcasting signal input to the input terminal I.

In a case where the length of the first microstrip line (AB) is λ/4, the length of the second microstrip line (ACD) should be 3λ/4(=λ/2+λ/4).

Further, referring to FIG. 3, the BALUN 140 may also have a microstrip line BD (hereinafter, referred to as "third microstrip line") for matching the impedance of an output port, the output terminals O1 and O2". According to an exemplary implementation, the third microstrip line (BD) can be realized in such a way that one end thereof is connected to one point on the first microstrip line AB and the other end is connected to one point of the second microstrip line ACD.

In an exemplary implementation, as shown in FIG. 3, the third microstrip line BD is realized as a microstrip line formed to be connected to the end point of the first microstrip line AB and to the end point of the second microstrip line ACD. The length of the third microstrip line (BD) is λ/2.

Figure 4:
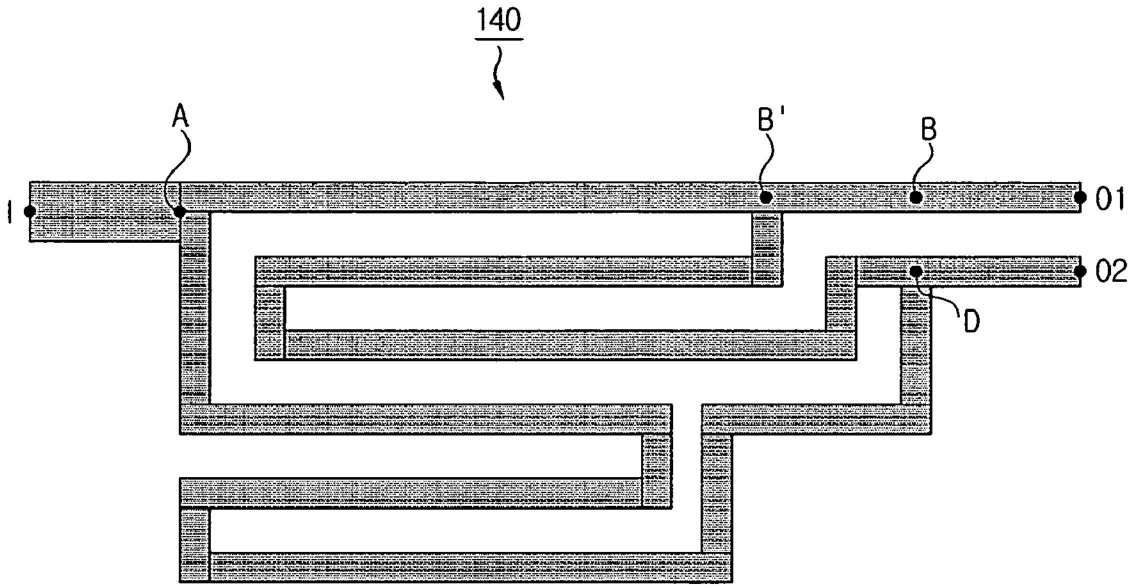
FIG. 4 is a plan view of a BALUN realized on a board of a broadcast receiving apparatus in accordance with an exemplary embodiment of the present invention.

FIG. 4 is a plan view showing an example of a BALUN substantially realized on a board of a broadcast receiving apparatus. The first microstrip line AB shown in FIG. 3 corresponds to a microstrip line extending from a point A to a point B, which is shown in FIG. 4.

Further, the second microstrip line ACD shown in FIG. 3 corresponds to a microstrip line extending from the point A to a point D. Unlike the microstrip line extending from the point A to the point B, the microstrip line extending from the point A to the point D is formed in the shape of zigzag. This is designed to decrease an area taken up by the second microstrip line AD because the length of the second microstrip line AD is comparatively long. The zigzag shape enables less area to be taken up by microstrip lines when compared to a strait line shape.

Finally, the third microstrip line BD shown in FIG. 3 corresponds to the microstrip line extending from the point B' to the point D, which is shown in FIG. 4.

In FIG. 4, the length of the first microstrip line AB is λ/4, the length of the second microstrip line AD is 3λ/4, and the length of the third microstrip line B'D is λ/2.

Exemplary implementations of a microstrip-type BALUN having an improved performance, including improved performance for high-frequency signals and a broadcast receiving apparatus using the same, as well as methods for forming the microstrip-type BALUN, have been disclosed above in the context of exemplary embodiments of the present invention. Broadcast receiving apparatuses, to which the BALUN can be applied, include, but are certainly not limited to, set top boxes (STB), TVs built-in STBs and the like.

As described above, since the microstrip-type BALUN according to certain exemplary embodiments of the present invention may be realized by using a microstrip line which is a distributed constant line, the microstrip-type BALUN has an improved performance, including improved performance for high-frequency signals. Similarly, the broadcast receiving apparatus to which the microstrip-type BALUN may be applied may also have improved performance for high-frequency broadcasting signals. In other words, the broadcast receiving apparatus according to exemplary embodiments of the present invention may have a better performance when receiving satellite broadcast using high-frequency signals than a conventional broadcast receiving apparatus.

The foregoing embodiment and advantages are merely exemplary and are not to be construed as limiting the present invention. The present teaching can be readily applied to other types of apparatuses. Also, the description of the above-described embodiments of the present invention are intended to be illustrative, and do not limit the scope of the present invention which is defined in the following claims, and their equivalents.

What is claimed is:

1. A broadcast receiving apparatus comprising:

a board;

a first broadcasting signal processing element formed on the board for outputting an unbalanced broadcasting signal;

a second broadcasting signal processing element formed on the board for receiving a balanced broadcasting signal as an input; and a balance to unbalance transformer (BALUN) comprising:

first and second input terminals;

first and second output terminals; and a microstrip line formed on the board for transforming the unbalanced broadcasting signal output from the first broadcasting signal processing element into the balanced broadcasting signal and outputting the balanced broadcasting signal to the second broadcasting signal processing element, wherein the second input terminal is directly connected to a ground, and wherein the microstrip line comprises:

a first microstrip line formed on the board and directly connected between the first input terminal and the first output terminal, wherein the unbalanced signal is transmitted from the first input terminal to the first output terminal as a first output signal;

a second microstrip line formed on the board and directly connected between the second input terminal and the second output terminal, wherein the unbalanced signal is transmitted from the second input terminal to the second output terminal as a second output signal with a phase difference of approximately 180 degrees with respect to the first output signal;

a third microstrip line formed on the board and directly connected between the first and second input terminals, wherein the third microstrip line is longer than the first microstrip line by approximately ¼ of an input wavelength of the unbalanced signal input through the input terminal; and a fourth microstrip line formed on the board and directly connected between the first and second output terminals, wherein the fourth microstrip line is longer than the second microstrip line by approximately ¼ of the input wavelength of the unbalanced signal input through the input terminal.

2. The broadcasting receiving apparatus as claimed in claim 1, wherein the second microstrip line is approximately equal to the first microstrip line.

3. The broadcast receiving apparatus as claimed in claim 2, wherein the fourth microstrip line facilitates matching the impedance between the first output terminal and the second output terminal.

4. The broadcast receiving apparatus as claimed in claim 3, wherein the lengths of the first and fourth microstrip lines, the second and third microstrip lines are different by approximately ¼ of the input wavelength, respectively.

5. A balance to unbalance transformer (BALUN) comprising:

a board;

first and second input terminals;

first and second output terminals; and a microstrip line formed on the board for transforming an unbalanced input signal into a balanced signal, wherein the second input terminal is directly connected to a ground, and wherein the microstrip line comprises:

a first microstrip line formed on the board and directly connected between the first input terminal and the first output terminal, wherein the unbalanced signal is transmitted from the first input terminal to the first output terminal as a first output signal;

a second microstrip line formed on the board and directly connected between the second input terminal and the second output terminal, wherein the unbalanced signal is transmitted from the second input terminal to the second output terminal as a second output signal with a phase difference of approximately 180 degrees with respect to the first output signal;

a third microstrip line formed on the board and directly connected between the first and second input terminals, wherein the third microstrip line is longer than the first microstrip line by approximately ¼ of an input wavelength of the unbalanced signal input through the input terminal; and a fourth microstrip line formed on the board and directly connected between the first and second output terminals, wherein the fourth microstrip line is longer than the second microstrip line by approximately ¼ of the input wavelength of the unbalanced signal input through the input terminal.

6. The BALUN as claimed in claim 5, wherein the second microstrip line is approximately equal to the first microstrip line.

7. The BALUN as claimed in claim 6, wherein the fourth microstrip line facilitates matching the impedance between the first output terminal and the second output terminal.

8. The BALUN as claimed in claim 7, wherein the lengths of the first and fourth microstrip lines, and the second and third microstrip lines are different by approximately ¼ of the input wavelength, respectively.

9. A method of forming a balance to unbalance transformer (BALUN) comprising:

forming first and second input terminals;

forming first and second output terminals;

forming a microstrip line on a board for transforming an unbalanced input signal into a balanced signal; and connecting the second input terminal directly to a ground, wherein the forming of the microstrip line comprises:

forming a first microstrip line on the board directly connected between the first input terminal and the first output terminal, wherein the unbalanced signal is transmitted from the first input terminal to the first output terminal as a first output signal;

forming a second microstrip line on the board directly connected between the second input terminal and the second output terminal, wherein the unbalanced signal is transmitted from the second input terminal to the second output terminal as a second output signal with a phase difference of approximately 180 degrees with respect to the first output signal;

forming a third microstrip line on the board directly connected between the first and second input terminals, wherein the third microstrip line is longer than the first microstrip line by approximately ¼ of an input wavelength of the unbalanced signal input through the first input terminal; and forming a fourth microstrip line formed on the board directly connected between the first and second output terminals, wherein the fourth microstrip line is longer than the second microstrip line by approximately ¼ of the input wavelength of the unbalanced signal input through the input terminal.

10. The method as claimed in claim 9, wherein the second microstrip line is approximately equal to the first microstrip line.

11. The method as claimed in claim 10, wherein the fourth microstrip line facilitates matching the impedance between the first output terminal and the second output terminal.

12. The method as claimed in claim 11, wherein the lengths of the first and fourth microstrip lines, and the second and third microstrip lines are different by approximately ¼, of the input wavelength, respectively.

* * * * *